(12) United States Patent
Melanson

(10) Patent No.: US 7,298,306 B2
(45) Date of Patent: Nov. 20, 2007

(54) DELTA SIGMA MODULATORS WITH COMPARATOR OFFSET NOISE CONVERSION

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/388,436

(22) Filed: Mar. 24, 2006

(65) Prior Publication Data

US 2007/0222657 A1    Sep. 27, 2007

(51) Int. Cl.
    *H03M 3/00*    (2006.01)
(52) U.S. Cl. .................................... 341/143; 341/118
(58) Field of Classification Search ............... 341/143, 341/118, 120, 144, 155, 141
    See application file for complete search history.

(56) References Cited

U.S. PATENT DOCUMENTS

| 4,918,623 | A | 4/1990 | Lockitt et al. | 709/224 |
|---|---|---|---|---|
| 5,870,052 | A | 2/1999 | Dedic et al. | 341/161 |
| 6,215,427 | B1 | 4/2001 | Bonhoure et al. | 341/118 |
| 6,380,881 | B2 | 4/2002 | Harada et al. | 341/165 |
| 6,642,873 | B1 * | 11/2003 | Kuang | 341/143 |
| 6,717,542 | B2 | 4/2004 | Harada | 341/161 |
| 6,809,674 | B1 | 10/2004 | Ramsden | 341/155 |
| 6,919,837 | B2 | 7/2005 | Harada et al. | 341/163 |
| 7,058,463 | B1 * | 6/2006 | Ruha et al. | 700/94 |
| 7,116,260 | B2 * | 10/2006 | Luh | 341/155 |
| 7,209,878 | B2 | 4/2007 | Chen | 704/220 |
| 7,221,303 | B1 | 5/2007 | Melanson | 341/143 |
| 2006/0077090 | A1 * | 4/2006 | Schimper | 341/155 |

* cited by examiner

*Primary Examiner*—Peguy JeanPierre
(74) *Attorney, Agent, or Firm*—Hamilton & Terrile, LLP; Kent B. Chambers

(57) ABSTRACT

Quantizers of delta sigma modulators include comparators to quantize a quantizer input signal. Each comparator compares a respective reference signal to the quantizer input signal. A logic processing module determines a quantizer output signal based upon the comparison. During subsequent periods of time, a comparator offset converter alters "reference signal-to-comparator input terminal" associations to reroute respective reference signals from one arrangement of comparator input terminals of at least two (2) of the comparators to a different arrangement of comparator input terminals. The comparator offset converter can randomly alter the reference signal-to-comparator input terminal associations. The comparator offset converter can maintain a 1:1 reference signal-to-comparator input terminal relationship. By maintaining the 1:1 ratio of reference signal-to-comparator input terminal and randomizing the reference signal-to-comparator input terminal associations, the comparator offset converter effectively converts the comparator offset voltage nonlinearities into energies and frequencies that can be constructively processed and improve signal-to-noise ratios.

22 Claims, 8 Drawing Sheets

DELTA SIGMA MODULATORS WITH COMPARATOR OFFSET NOISE CONVERSION

CROSS REFERENCED PATENT APPLICATIONS

This patent application cross-references U.S. application Ser. No. 11/388,397, filed on Mar. 24, 2006, entitled "Delta Sigma Modulator Analog-to-Digital Converters with Quantizer Output Prediction and Comparator Reduction" by inventor John Melanson, and U.S. application Ser. No. 11/388,425, filed on Mar. 24, 2006, entitled "Delta Sigma Modulator Analog-to-Digital Converters with Multiple Threshold Comparisons during a Delta Sigma Modulator Output Cycle" by inventor John Melanson.

BACKGROUND OF THE INVENTION

1. Field of the Invention

The present invention relates in general to the field of information processing, and more specifically to a signal processing system and method for converting comparator offset noise in delta sigma modulator analog-to-digital comparators into multi-spectral noise.

2. Description of the Related Art

Many signal processing systems include delta sigma modulators to quantize an input signal into one or more bits. Delta sigma modulators trade-off increased noise in the form of quantization error in exchange for high sample rates and noise shaping. "Delta-sigma modulators" are also commonly referred to using other interchangeable terms such as "sigma-delta modulators", "delta-sigma converters", "sigma delta converters", and "noise shapers".

FIG. 1 depicts an analog-to-digital converter (ADC) delta sigma modulator 100 that receives an analog input signal x(t) and converts the input signal x(t) into a series of low resolution, digital output pulses q(n), where t represents an instant in time, n is an integer and represents the $n^{th}$ sample. In general, the delta sigma modulator 100 quantizes a difference between the current input signal x(t) and an analog version of the previous quantizer output signal, i.e. q(t−1). In the feedback loop of delta sigma modulator 100, a digital-to-analog converter (DAC) 108 converts each delayed ($z^{-1}$) output signal q(n−1) into an analog signal q(t−1). The feedback loop of delta sigma modulator 100 also includes dynamic element matching 106 to correct nonlinearities in the DAC 108 signal q(n−1).

The noise shaping loop filter 102 processes a difference between input signal x(t) and the delayed output signal q(t−1) to generate a loop filter output signal/quantizer input signal $V_{LF}$. During each output cycle of delta sigma modulator operation, quantizer 104 quantizes signal $V_{LF}$ to generate output signal q(n), generally in the form of digital data. When loop filter 102 is a continuous time filter, the quantizer 104 represents a relatively low-accuracy ADC converter operating at an oversampling rate, such as a rate of 64:1. Quantizer 104 can provide multi-bit or one-bit output quantization levels. The quantization level step size, Δ, represents the difference between each quantization level. One-bit quantizers have only two quantization levels specified as {−Δ/2, Δ/2} or {−1,1}. Shreier and Temes, *Understanding Delta-Sigma Signal Converters*, IEEE Press, 2005 (referred to herein as "Shreier & Temes") describes conventional delta-sigma modulators in more detail.

Multi-bit ADC delta sigma modulators exhibit some well-known advantages over single bit ADC delta sigma modulators such as reduced quantization noise. However, quantizer design continues to represent one of the significant challenges confronting delta sigma modulator designers.

FIG. 2 depicts a flash-type quantizer 200, which represents one embodiment of quantizer 104. Quantizer 200 includes r comparators 202.0-202.r−1, each having a first input connected to the output of loop filter 102 to receive quantizer input signal $V_{LF}$. "r" is a positive integer representing the number of comparators in delta sigma modulator 100. Each of the comparators 202.0-202.r−1 includes a second input to receive respective reference voltages $V_0$ through $V_{r-1}$. The reference voltages serve as reference signals to quantize the quantizer input signal $V_{LF}$. A resistor string reference ladder of r−1 resistors 204.1-204.r−1 of value R generates uniform voltage drops across at least reference resistors 204.1-204.r−1 to generate respective reference voltages $V_0$ through $V_{r-1}$. The end resistors 204.0 and 204.r have values that can be used to scale the quantization levels (also referred to as a "quantizer step"). For example, the largest quantizer threshold may be 1.2 V, but the available reference may be 2.5 V, so resistors 204.0 and 204.r are set to achieve the desired scale. A reference voltage of +Vref to −Vref is applied across the reference resistors 204.0-204.r. +/−Vref is, for example, +/−1.5 Volts (V).

Each of comparators 202.0-202.r−1 compares the quantizer input signal $V_{LF}$ with respective reference voltages $V_0$ through $V_{r-1}$. The $i^{th}$ comparator 202.i generates a logical zero (e.g. 0V) when the $i^{th}$ reference voltage $V_i$ is less than or equal to the loop filter output/quantizer input signal $V_{LF}$ and a logical one (e.g. +2.5 V) when $V_i > V_{LF}$. Once during each output cycle of quantizer 104 operation, digital encoder 206 encodes the output signals of comparators 202.0-202.r−1 into a digital (discrete) output signal q(n).

Increasing the number of comparators in quantizer 104, i.e. increasing the value of r, yields a higher quality output signal q(n) (e.g. less quantization noise) and higher signal bandwidth capabilities. Each time r doubles, delta sigma modulator 100 typically achieves a 6 dB quantization noise improvement. However, disadvantages also accompany increasing the number of comparators in quantizer 104. For example, increasing the number of comparators requires more physical area to implement and more power to operate. Additionally, increasing the number of comparators decreases voltage spacing between adjacent reference voltages $V_i$ and $V_{i+1}$ and increases the relative effects of non-idealities, such as comparator offset voltages.

Comparator offset voltages represent the minimum direct current (DC) input voltage that would have to be applied to input terminals of the comparator to cause the comparator to transition state. Thus, comparator offset voltages can cause error in the comparator outputs, especially when the difference between the reference input signals of adjacent comparators is small. Accordingly, as the relative effects of quantizer non-idealities increase, the nonidealities cause increasing delta sigma modulator error. The non-linearity can cause harmonic distortion, especially at high signal frequencies, increased noise, and modulation of noise with the direct current (DC) input level, all of which are undesirable.

An example with the number of comparators equal to r=16 illustrates effects of comparator nonidealities. Assuming seventeen (17) quantization levels, normalized to −8, −7, −6, ..., −1, 0, +1, +2, ..., +8, the input reference voltages $V_0$ through $V_{15}$ to respective comparators 202.0-202.r−1 scale to normalized values of −7.5, −6.5, −5.5, ..., −0.5, +0.5, ..., +5.5, +6.5, +7.5. Each of the actual reference voltages $V_{-v.5}$ scale with the analog system reference voltage $V_{ref}$. For example, if level −8 corresponds to −1.5 V and level +8 corresponds to +1.5 V, then the respective comparator input voltage references $V_0$ through $V_{15}$ for comparators 202.0-202.r−1 are −7.5/8*1.5, −6.5/8*1.5, . . . , +6.5/8*1.5, and +7.5/8*1.5V. Thus, as the number of comparators increases, the voltage reference spacing decreases for a given reference voltage +/−$V_{ref}$. It follows that as the number of comparators increases, eventually non-linearities, such as comparator offset voltages, of the flash-type quantizer 200 eventually counteract any advantage obtained by increasing the number of comparators. Additionally, in an integrated circuit, chip area is valuable. Increasing the number of comparators requires more chip area and, thus, can become a dominant disadvantage.

Despite developments in quantizer technology, ADC delta sigma modulator quantizer design can still be improved to reduce the effects of comparator non-idealities, such as comparator offset voltages.

SUMMARY OF THE INVENTION

In one embodiment of the present invention, a signal processing system includes an analog-to-digital delta sigma modulator. The delta sigma modulator includes a loop filter, coupled to the multiple comparators, to provide an input signal to be quantized. The delta sigma modulator also includes multiple comparators coupled to the loop filter, each of the comparators having two input terminals to respectively receive a reference signal and the input signal to be quantized and each comparator having an offset. The delta sigma modulator also includes a comparator offset converter, coupled to the N comparators, to reroute N respective reference signals from a first arrangement of comparator input terminals to a second arrangement of comparator input terminals to convert the comparator offsets into noise, wherein N is an integer greater than one (1).

In another embodiment of the present invention, a method of converting delta sigma modulator comparator offsets into noise includes receiving N reference signals on a first arrangement of input terminals of N respective comparators of the delta sigma modulator during a first period of time, wherein N is an integer greater than one (1). The method also includes rerouting the N reference signals to a second arrangement of input terminals of the respective comparators of the delta sigma modulator during a second period of time to convert the comparator offsets into noise.

In a further embodiment of the present invention, a method of converting delta sigma modulator comparator offsets into noise includes receiving N reference signals on input terminals of N respective comparators of the delta sigma modulator during a first delta sigma modulator output cycle, wherein each reference signal is associated with one of the comparator input terminals to form a reference signal-to-comparator input terminal association to convert the comparator offsets into noise and N is an integer greater than (1). The method also includes altering at least one of the reference signal-to-comparator input terminal associations during a next delta sigma modulator output cycle.

In another embodiment of the present invention, a delta sigma modulator includes a loop filter to receive an input signal and a quantizer output signal and generate a quantizer input signal and a quantizer to receive the quantizer input signal and generate the quantizer output signal. The quantizer includes a reference signal generator to generate N reference signals, wherein N is an integer greater than one (1). The quantizer also includes a comparator offset converter coupled to the reference signal generator to alter reference signal-to-comparator input terminal associations during subsequent delta sigma modulator output cycles to convert comparator offsets to noise. The quantizer further includes a plurality of N comparators coupled to the comparator offset converter to receive and compare the reference signals and the quantizer input signal and to generate comparison data. The quantizer also includes an encoder coupled to the comparators to receive the comparison data, to quantize the quantization input signal based upon the comparison data, and to generate the quantizer output signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
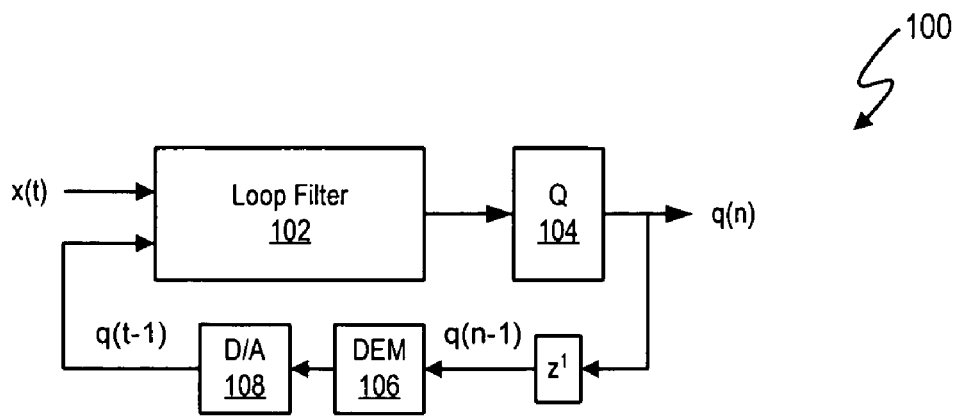
FIG. 1 (labeled prior art) depicts an analog-to-digital converter (ADC) delta sigma modulator.
Figure 2:
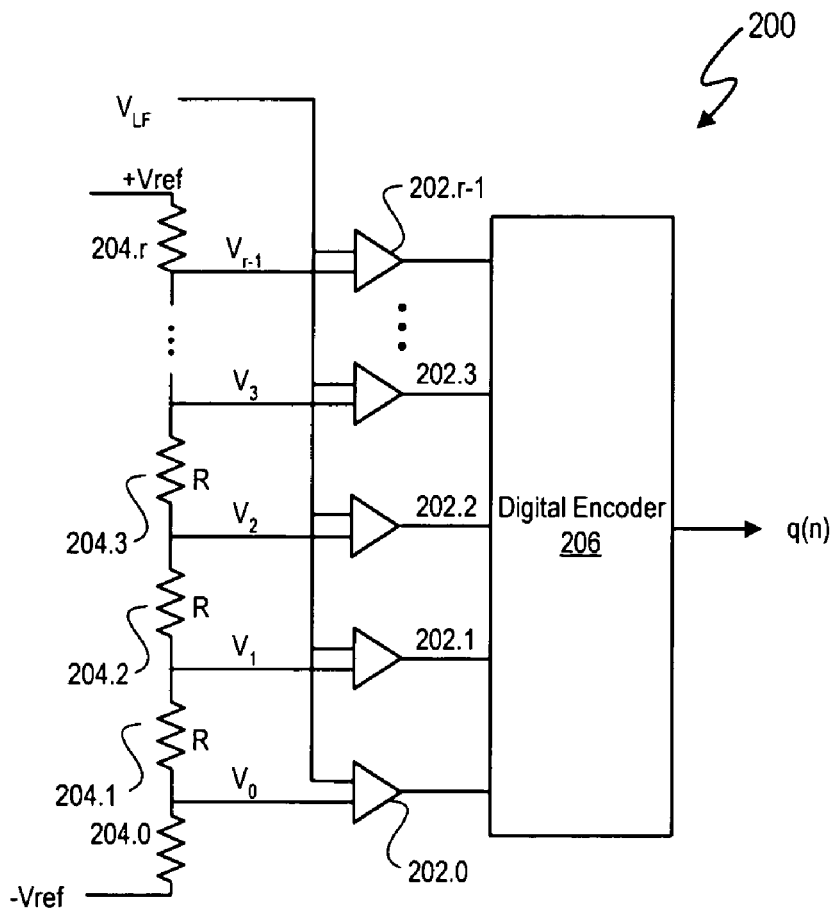
FIG. 2 (labeled prior art) depicts a flash-type quantizer of a delta sigma modulator.

The quantizers of delta sigma modulators in the signal processing systems described herein utilize multiple comparators to quantize a quantizer input signal. Each comparator compares a respective reference signal to the quantizer input signal. A logic processing module determines a quantizer output signal based upon the comparison. During subsequent periods of time, a comparator offset converter alters "reference signal-to-comparator input terminal" associations to reroute respective reference signals from one arrangement of comparator input terminals of at least two (2) of the comparators to a different arrangement of comparator input terminals. In at least one embodiment, the comparator offset converter randomly changes the arrangement of comparator input terminals from one time period to the next time period. In other words, the comparator offset converter randomly alters the reference signal-to-comparator input terminal associations during subsequent time periods.

The comparator offset converter can maintain a 1:1 reference signal-to-comparator input terminal relationship, i.e., one input terminal of each comparator receives one reference signal. By maintaining the 1:1 ratio of reference signal-to-comparator input terminal and randomizing the reference signal-to-comparator input terminal associations, the comparator offset converter effectively converts the comparator offset voltage nonlinearities into energies and frequencies that can be constructively processed and, in at least one embodiment, improve signal-to-noise ratios. In at least one embodiment, the comparator offset voltages are converted into additive multi-spectral noise, such as additive white noise. The multi-spectral noise can be part of system dithering and is severely attenuated by the loop filter. Multi-spectral noise refers to noise having energy that is distributed among multiple frequencies with approximately equal energy levels. "White noise" is, in general, noise having energy that is approximately constant for each frequency within a given frequency range, such as 0 to ½ a delta sigma modulator sample rate.

In at least one embodiment, the comparator voltage offset reducer includes a comparator offset converter that alters the routing of reference signals to input terminals of the comparators during subsequent periods of time. The comparator offset converter includes one or more multiplexers to change which of the respective reference signals that each of the one or more comparators receives during subsequent periods of time.

In at least one embodiment, the comparator voltage offset reducer includes a chopping circuit. The chopping circuit includes multiplexers coupled to the input terminals of the comparators to effectively toggle the inputs of the comparators. The chopping circuit receives a random chopping control signal to cause the chopping circuit to randomly toggle the comparator input terminals. Toggling the comparator input terminals effectively converts the comparator offset voltage into additive multi-spectral noise, such as additive white noise. The chopping control signal can be exclusively OR'ed with each of the respective comparator outputs to restore proper polarity.

In another embodiment, randomizing the reference signal-to-comparator input terminal associations and chopping circuits can be respectively utilized with a subset of the comparators in the quantizer. For example, in one embodiment, only reference signals to adjacent pairs of comparators are randomly altered and/or only a limited number of comparator input terminals are randomly chopped. This limited scope of randomization and chopping has lower complexity implementation but achieves only limited offset related performance improvements.

In another embodiment, the chopping circuit and comparator offset converter are combined to obtain an even better whitening of the additive comparator offset.

Figure 3:
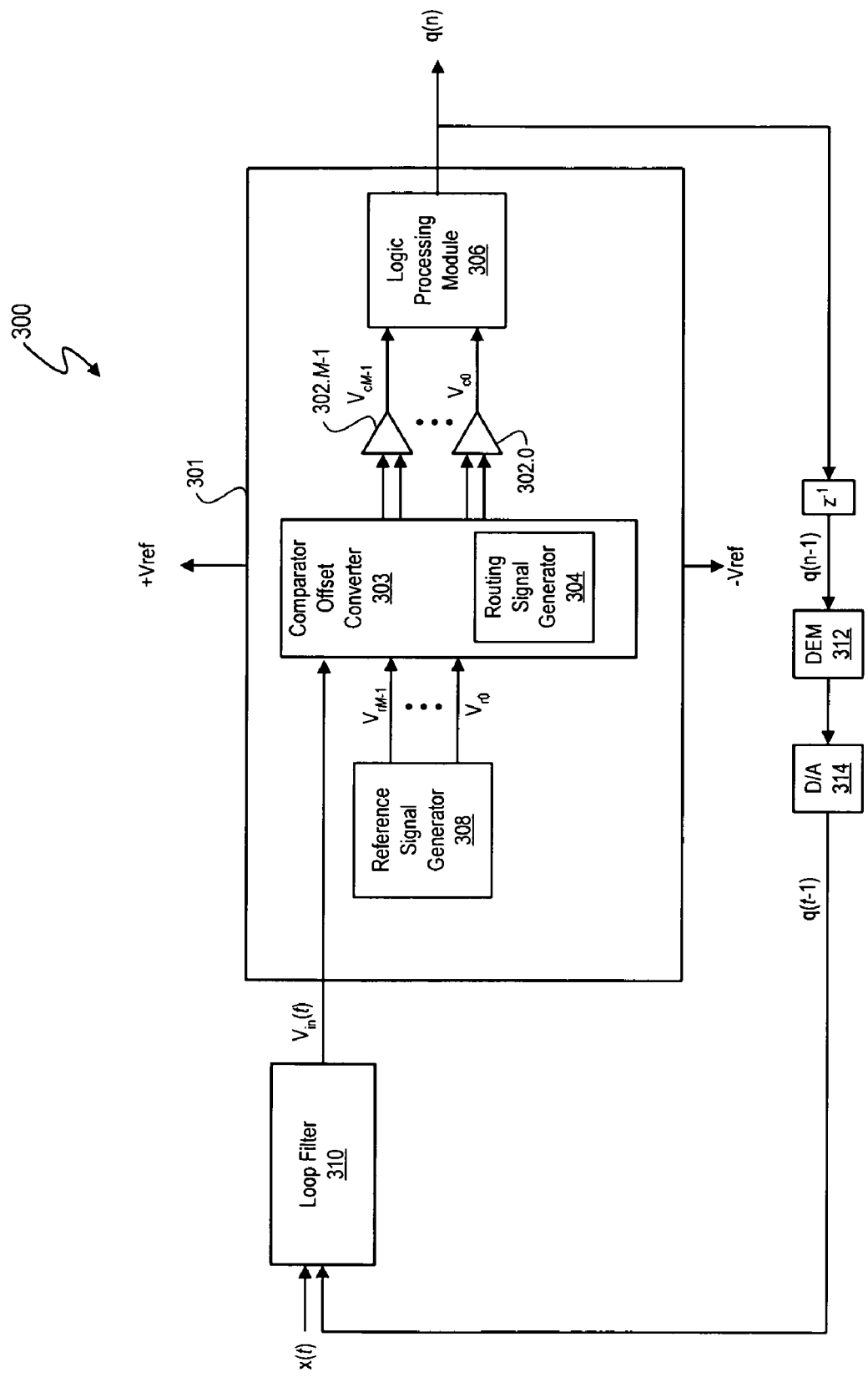
FIG. 3 depicts a delta sigma modulator with comparator offset noise conversion capabilities.

FIG. 3 depicts one embodiment of a delta sigma modulator 300 with comparator offset noise conversion capabilities. Delta sigma modulator 300 includes a quantizer 301 to quantize an output signal of loop filter 310. In one embodiment, loop filter is a $j^{th}$ order analog filter, where j represents the order of loop filter 310 and is an integer greater than one (1). The digital quantizer output signal q(n) is fed back through optional dynamic element matching elements (DEMS) 312 and digital-to-analog converter (DAC) 314 to generate a delayed, analog loop filter input signal q(t−1). Loop filter 310 provides noise shaping to a difference between analog input signal x(t) and analog, loop filter input signal q(t−1). Embodiments of loop filter 310, DEMs 312, and DAC 314 are described in more detail in Shreier & Temes. Quantizer 301 can be incorporated into any ADC delta sigma modulator.

Quantizer 301 includes a comparator offset converter 303 to convert non-idealities of comparator voltage offsets of comparators 302.0-302.M−1 into multi-spectral noise with frequencies and energy levels that can be constructively processed by delta sigma modulator 300, where "M" is the number of comparators. During subsequent periods of time, a comparator offset converter alters "reference signal-to-comparator input terminal" associations to reroute respective reference signals from one arrangement of comparator input terminals of at least two (2) of the comparators to a different arrangement of comparator input terminals. The arrangement of comparator input terminals refers to the 1:1 associations of reference signals to comparator input terminals during a period of time. In at least one embodiment, reference signals are randomly rerouted to different comparator input terminals during subsequent periods of time to form 1:1 associations of reference signals to comparator input terminals that differ from one period of time to the next period of time. The comparator offset voltages are thereby converted into additive multi-spectral noise, such as additive white noise.

Quantizer 301 also includes a reference signal generator 308 to generate the reference signals $V_{r0}$ through $V_{rM-1}$. Each of comparators 302.0 through 302.M−1 ("302.0-302.M−1") includes an input terminal to receive a quantizer input voltage $V_{in}(t)$. "$V_{in}(t)$" represents the quantizer input signal at any instant in time t. The quantizer input signal $V_{in}(t)$ is generally the direct output of a loop filter, such as loop filter 310, and is the signal to be quantized by quantizer 301. The comparators 302.0-302.M−1 also each include an input terminal to receive a respective reference signal $V_{r0}$, $V_{r1}$, . . . , $V_{rM-1}$. During each approximation cycle, the comparators 302.0-302.M−1 compare the quantizer input signal $V_{in}$ to the respective reference signals generated by reference signal generator 308.

Upon each comparison between the quantizer input signal and a reference signal, comparators 302.0 through 302.M−1 provide respective comparator output signals $V_{c0}$, $V_{c1}$, . . . , $V_{cM-1}$ (collectively referred to as "comparison data") that represent the outcome of the respective comparisons. In at least one embodiment, the comparator output signal $V_{ci}$ of the $i^{th}$ comparator 302.i is a logical one (1) if the input signal $V_{in}$ is greater than the reference signal provided to the $i^{th}$ comparator 302.i, and is a logical zero (0) if the input signal $V_{in}$ is less than or equal to the reference signal provided to the $i^{th}$ comparator 302.i, where $i \in \{0, 1, \ldots, M-1\}$.

Quantizer 301 includes a logic processing module 306 to (i) receive the comparator output signals $V_{c0}$, $V_{c1}$, . . . , $V_{cM-1}$ of each of respective comparators 302.0-302.M−1 and (ii) encode the outputs of comparators 302.0 through 302.M−1 as the quantizer output signal q(n). Based on the values of each of the applied reference signals and the comparator output signals $V_{c0}$, $V_{c1}$, . . . , $V_{cM-1}$, logic processing module 306 determines an estimation of the current value of the quantizer input signal $V_{in}(t)$. In at least one embodiment, the logic processing component 306 is a base 1 to base 2 encoder (unary to binary conversion).

Figure 4:
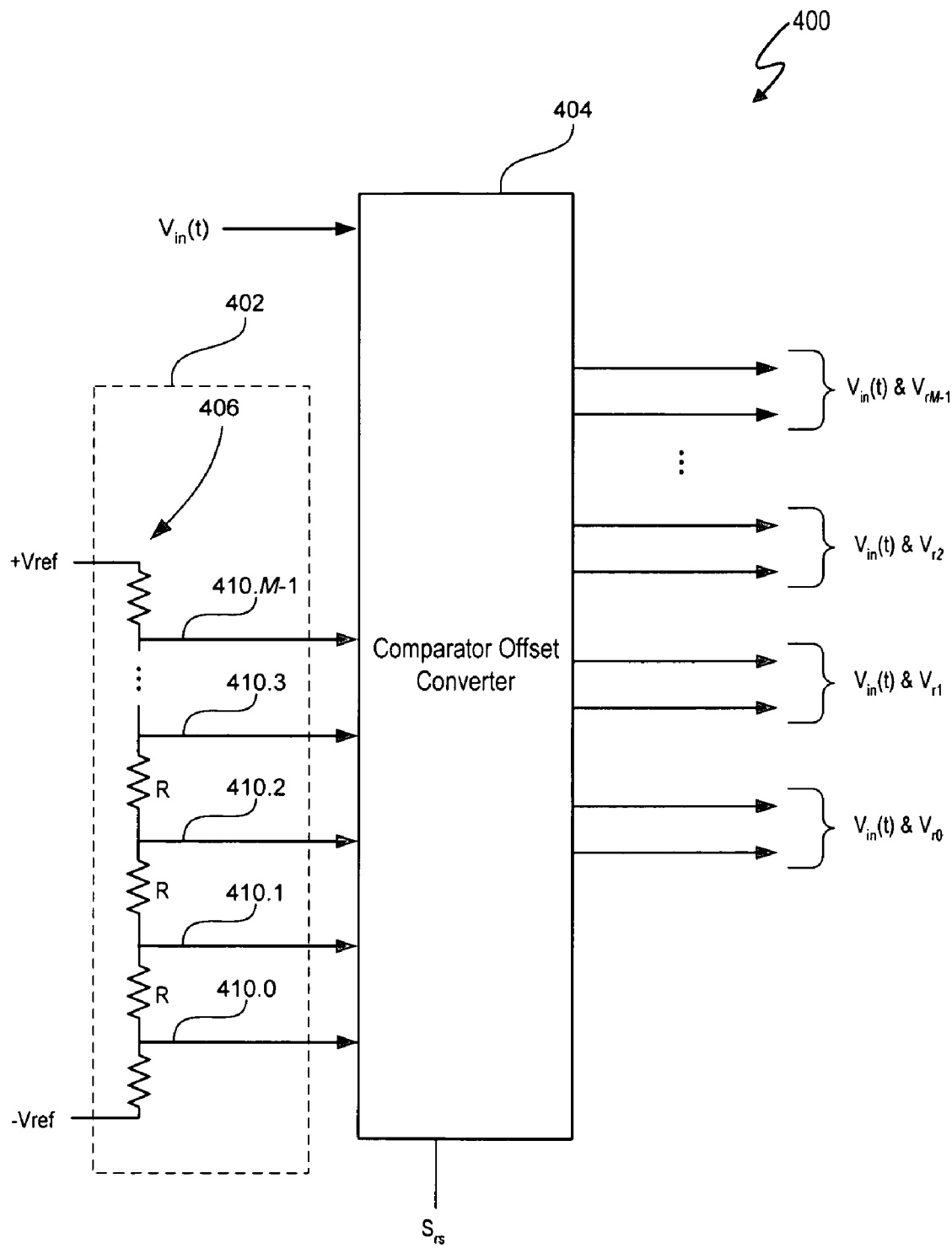
FIG. 4 depicts a reference signal generator and comparator offset converter of the delta sigma modulator of FIG. 3.

FIG. 4 depicts circuitry 400 with a reference signal generator 402, which represents one embodiment of reference signal generator 308. Circuitry 400 of FIG. 4 also depicts comparator offset converter 404, which represents one embodiment of comparator offset converter 303. In at least one embodiment, reference signal generator 402 includes a resistor string reference ladder 406 of M−1 reference resistors in series to generate uniform voltage drops across each of the reference resistors. The value of the end resistors in resistor string reference ladder 406 are selected for proper scaling of the reference signals $V_{r0}$, $V_{r1}$, . . . , $V_{rM-1}$ to achieve the desired quantization levels. In at least one embodiment, each of reference resistors 406 has a resistance of R. The value of R is a matter of design choice and depends upon, for example, the value of reference voltage Vref and properties of the particular resistors used.

To generate the reference signals 410.0 through 410.M−1, a reference voltage of +Vref to −Vref is applied across the reference resistors in resistor string reference ladder 406. "+/−Vref" is, for example, +/−1.5 Volts (V). The resistor string reference ladder 406 is preferably designed, as understood by those of ordinary skill in the art, to have differential non-linearity and integral non-linearity characteristics that are acceptable for the intended use of the quantizer 401. In other embodiments, reference signal generator 402 uses other types of impedances, such as capacitors, or other circuit component types to generate the selected reference signals $V_{r0}, V_{r1}, \ldots, V_{rM-1}$. In at least one embodiment, the reference signals are generated upon request using configurable components.

The voltage signals from resistor string reference ladder 406 are applied to comparator offset converter 404. The comparator offset converter 404 alters the routing of reference signals to input terminals of at least two of the comparators during subsequent periods of time. In at least one embodiment, altering of the routing of reference signals to comparator input terminal maintains a 1:1 reference signal-to-comparator input terminal relationship, i.e. each comparator input receives one reference signal. Additionally, the particular sequence of alternate routings of reference signals to comparator input terminals converts the comparator offset voltages into additive multi-spectral noise, such as additive white noise. The additive noise can be part of delta sigma modulator 300 dithering. In at least one embodiment, to convert the comparator offset voltages into additive noise, the particular sequence of alternate routings is random or at least pseudo-random (collectively referred to herein as "random").

The comparator offset converter 404 can connect any of the reference signals 406.0 through 406.M−1 to any respective input terminal of comparators 302.0 through 302.M−1 (FIG. 3). The routing signal generator 304 generates routing signal $S_{rs}$ to control the routing of reference signals to comparator input terminals. Routing signal $S_{rs}$ controls the input-output connections of one or more multiplexers to alter reference signal-to-comparator input terminal associations during subsequent periods of time, i.e. change the particular respective reference signal that each of the one or more comparators receives during subsequent periods of time. The values of routing signal $S_{rs}$ are generated to preferably cause random rerouting of the reference signals. The particular subsequent periods of time are a matter of design choice. In the preferred embodiment, each successive approximation cycle represents a subsequent period of time.

The routing signal $S_{rs}$ is generated, for example, internally by routing signal generator 304 as depicted in FIG. 3 or externally by, for example, a random number generator. Thus, the routing signal $S_{rs}$ controls the particular sequence and particular routings of reference signals to comparator input terminals. In at least one embodiment, the routing signal $S_{rs}$ produces a random sequence of alternate routings during subsequent time periods. Converter 404 maintains a 1:1 reference signal-to-comparator input terminal relationship, i.e., an input terminal of each comparator receives one reference signal. By maintaining the 1:1 ratio of reference signal-to-comparator input terminal and randomizing the reference signal-to-comparator input terminal associations, the comparator offset converter 404 effectively converts the comparator offset voltage nonlinearities into additive white noise.

Figure 5:
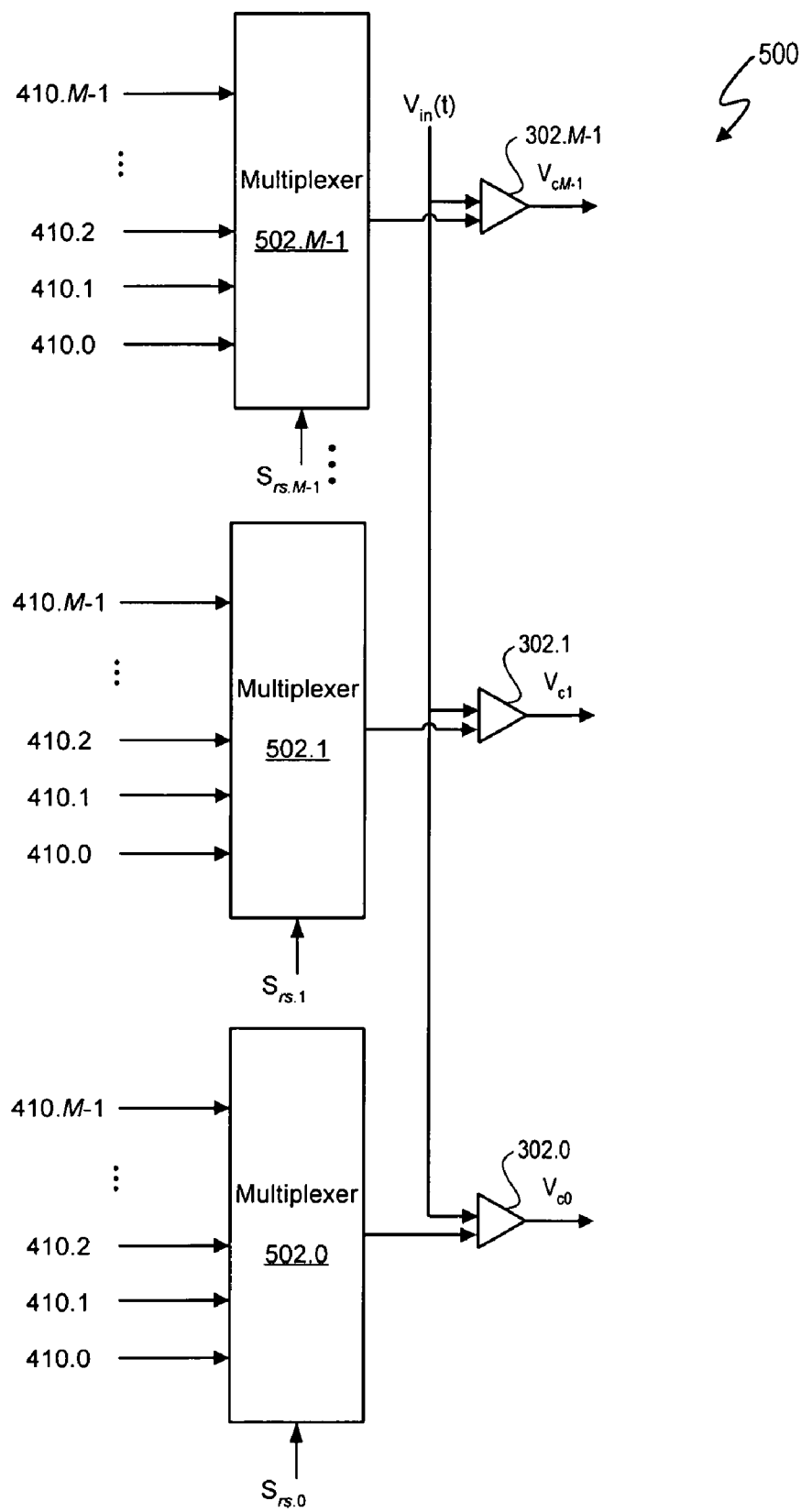
FIG. 5 depicts a first digital reference signal router of the comparator offset converter of FIG. 4.

FIG. 5 depicts a reference signal router 500, which represents one embodiment of comparator offset converter 404. The reference signal router 500 includes M number of M input, 1 output analog multiplexers 502.0 through 502.M−1. The routing signal $S_{rs}$ can be represented by an M×M array of bits. The $i^{th}$ row of bits, $\{S_{rs.i.0}, S_{rs.i.1}, \ldots S_{rs.i.M-1}\}$, controls the routing of the reference signals 410.0 through 410.M−1 to the $i^{th}$ comparator 302.i. For example, during a first period of time, if the bits $\{S_{rs.1.0}, S_{rs.i.1}, \ldots, S_{rs.i.M-1}\}$ of control signal $S_{rs}$ equal $\{0, 1, 0, \ldots, 0\}$, reference signal 410.2 is connected to an input terminal of comparator 302.1, bits $\{S_{rs.M-1.0}, S_{rs.M.1}, \ldots S_{rs.M.M-1}\}$ equal $\{1, 0, 0, \ldots, 0\}$, reference signal 410.0 is connected to an input terminal of comparator 302.M−11, and so on, during the first period of time the reference signals 410.0 through 410.M−1 are routed to a first arrangement of comparator input terminals. During a second period of time, the values of the bits of routing $S_{rs}$ are changed (preferably randomly changed) so that the reference signals 410.0 through 410.M−1 are routed to a second arrangement of comparator input terminals. The process of altering the routing of reference signals to comparator input terminals during subsequent periods of time continues so that the comparator offset voltages are converted into additive white noise.

In at least one embodiment, the values of each bit in the routing signal $S_{rs}$ are set to produce a random sequence of alternate routings during subsequent time periods to convert the comparator offset voltage nonidealities into additive white noise. FIG. 5 show the implementation where all reference signals are flexibly re-routed. For an M signal implementation, this requires $M^2$ analog switches in the multiplexers, and M! routing possibilities. Satisfactory results can be obtained with a subset of these routings, i.e., 16 signals can be re-routed in groups of 4, requiring 64 switches, instead of 256. In the case of 4 to 4 routing, there are 24 possible routings which maintain the 1:1 rule. A subset of these routings may be used. If 16 routings are used, there is minimal degradation in performance, but it is easier to create a random number from 0-15 than from 0-23. These design trade-off allow the designer to trade circuit complexity for performance. Even with simple re-routing schemes, the performance will be significantly enhanced beyond no random re-routing. As an example, the following routing scheme could be used. The example will be for the four (4) comparator case. "x" is set as a 4-bit random number from a pseudo-random number generator. Voltages vr0,vr1,vr2, vr3 are the voltages presented to the four (4) comparators.

| x | vr0 | vr1 | vr2 | vr3 |
|---|------|------|------|------|
| 0 | −1.5 | −0.5 | +0.5 | +1.5 |
| 1 | −0.5 | −1.5 | +0.5 | +1.5 |
| 2 | −1.5 | −0.5 | +1.5 | +0.5 |
| 3 | −0.5 | −1.5 | +1.5 | +0.5 |
| 4 | +0.5 | −0.5 | −1.5 | +1.5 |
| 5 | +0.5 | −1.5 | −0.5 | +1.5 |
| 6 | +1.5 | −0.5 | −1.5 | +0.5 |
| 7 | +1.5 | −1.5 | −0.5 | +0.5 |
| 8 | −1.5 | +1.5 | +0.5 | −0.5 |
| 9 | −0.5 | +1.5 | +0.5 | −1.5 |
| 10 | −1.5 | +0.5 | +1.5 | −0.5 |
| 11 | −0.5 | +0.5 | +1.5 | −1.5 |
| 12 | +0.5 | +1.5 | −1.5 | −0.5 |
| 13 | +0.5 | +1.5 | −0.5 | −1.5 |
| 14 | +1.5 | +0.5 | −1.5 | −0.5 |
| 15 | +1.5 | +0.5 | −0.5 | −1.5 |

In another embodiment, altering the reference signal-to-comparator input terminal associations can be utilized with a subset of the comparators 302.0 through 302.M−1. For example, in one embodiment, only reference signals to adjacent pairs of comparators are rerouted (preferably randomly rerouted) to form a new arrangement of reference signal-to-comparator input terminal associations. This limited scope of rerouting has lower complexity implementation but achieves only limited performance improvements.

Figure 6:
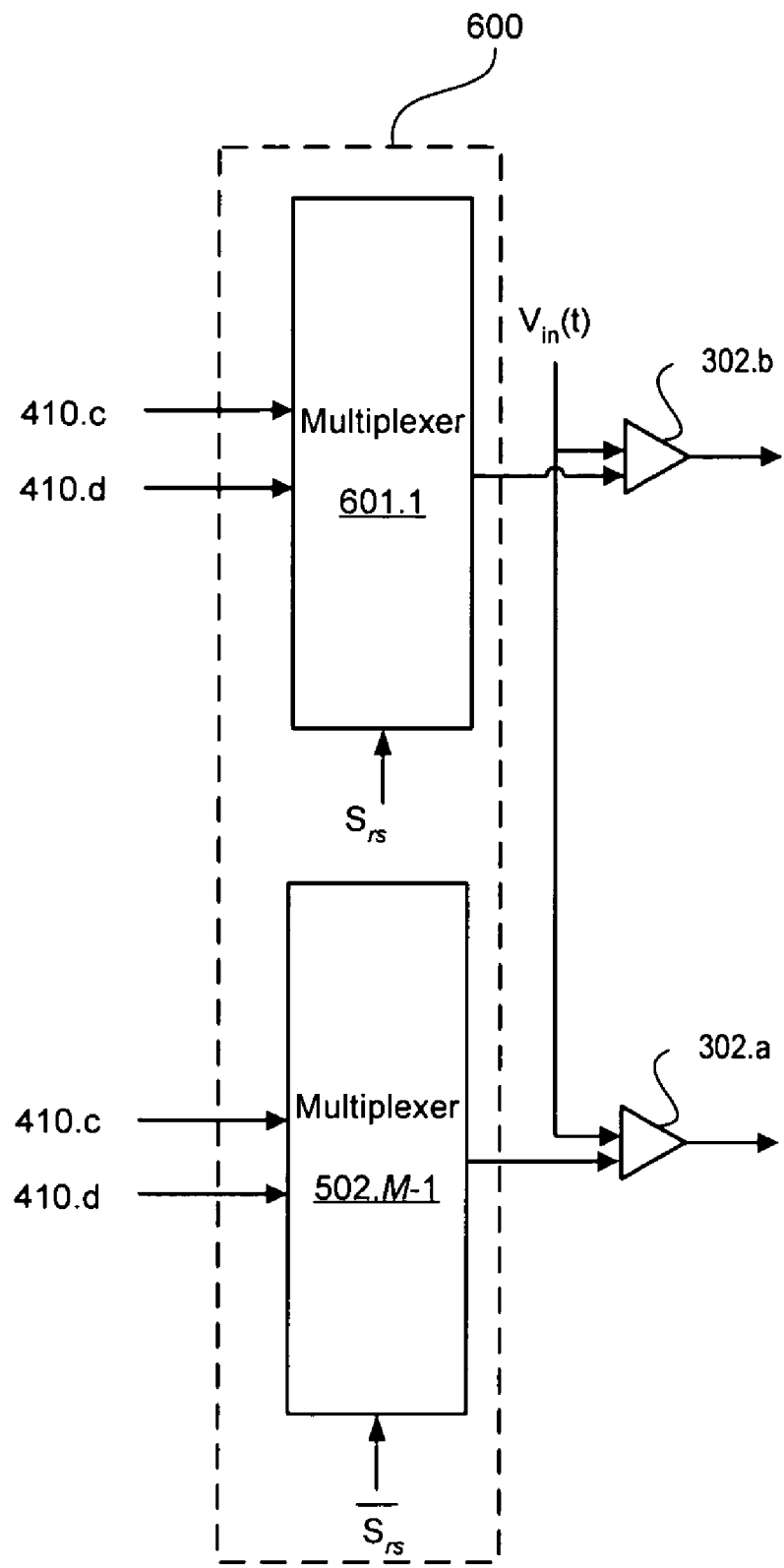
FIG. 6 depicts a second digital reference signal router of the comparator offset converter of FIG. 4.

FIG. 6 depicts a reference signal router 600, which represents another embodiment of comparator offset converter 404. Reference signal router 600 represents an embodiment of comparator offset converter 404 that provides limited altering of the reference signal-to-comparator input terminal associations during subsequent periods of time. Limited rerouting can be realized by restricting signal routing alternatives to a subset of the comparators 302.0 through 302.M−1 and/or within multiple subsets of the comparators 302.0 through 302.M−1. For example, in one embodiment, only routing of reference signals to adjacent pairs of comparators is altered during subsequent periods of time. This limited scope of rerouting has lower complexity implementation but achieves only limited performance improvements. The specific sequence of rerouting of reference signals by reference signal router 600 preferably converts the comparator offset into additive white noise.

Reference signal router 600 includes multiplexers to reroute reference signals to new arrangements of comparator input terminals during subsequent periods of time. The number of multiplexers and the input-to-output ratios are determined by the scope of reference signal rerouting. For example, 2-2×1 multiplexers 601.0 and 601.1 respectively reroute reference signals 410.c and 410.d to comparators 302.a and 302.b. As the input-to-output ratios and number of multiplexers increases, the number of reference signal rerouting options also increases. Routing signal $S_{rs}$ controls routing of reference signals by the multiplexers 601.0 and 601.1. For 2-2×1 multiplexers, routing signal $S_{rs}$ can be 1-bit, with the routing signal $S_{rs}$ applied to multiplexer 601.0 and the complement of routing signal $S_{rs}$ ($\overline{S}_{rs}$).

In at least one embodiment, multiplexers and routing signal $S_{rs}$ maintain 1:1 reference signal-to-comparator input terminal associations. For example, if $S_{rs}$=0, multiplexer 601.0 routes reference signal 410.c to comparator 302.a, and multiplexer 601.0 routes reference signal 410.d to comparator 302.b.

Figure 7:
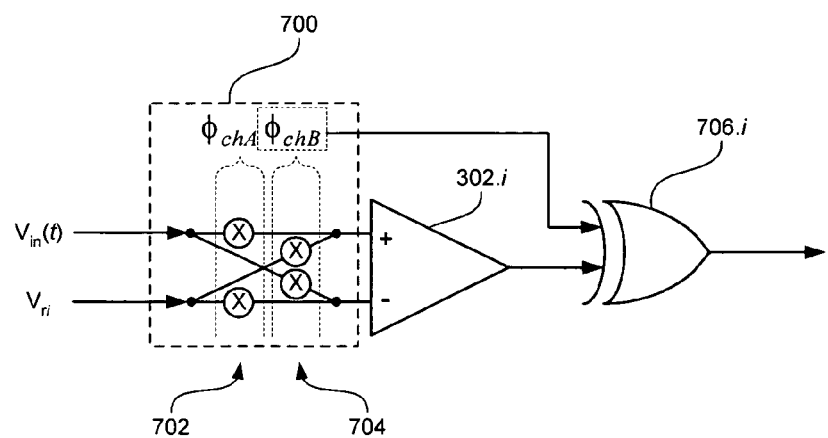
FIG. 7 depicts a chopping circuit of the comparator offset converter of FIG. 4.

FIG. 7 depicts a chopping circuit 700, which represents another embodiment of comparator offset converter 404. The chopping circuit 700 includes switches 702 connected to the input terminals of the $i^{th}$ comparator 302.i to effectively chop (i.e. toggle) the input signals $V_{in}(t)$ and the $i^{th}$ reference signal $V_{ri}$ to comparator 302.i. Chopping control signals $\Phi_{chA}$ and $\Phi_{chB}$ control the toggling of input signals $V_{in}(t)$ and $V_{ri}$ by, for example, ensuring nonoverlapping conductivity of switches 702 and 704. By randomly changing the values of control signals $\Phi_{chA}$ and $\Phi_{chB}$ and, thus, randomly toggling the input terminals of comparator 302.i, chopping circuit 700 effectively converts the comparator offset voltage into additive multi-spectral noise, such as additive white noise.

Figure 8:
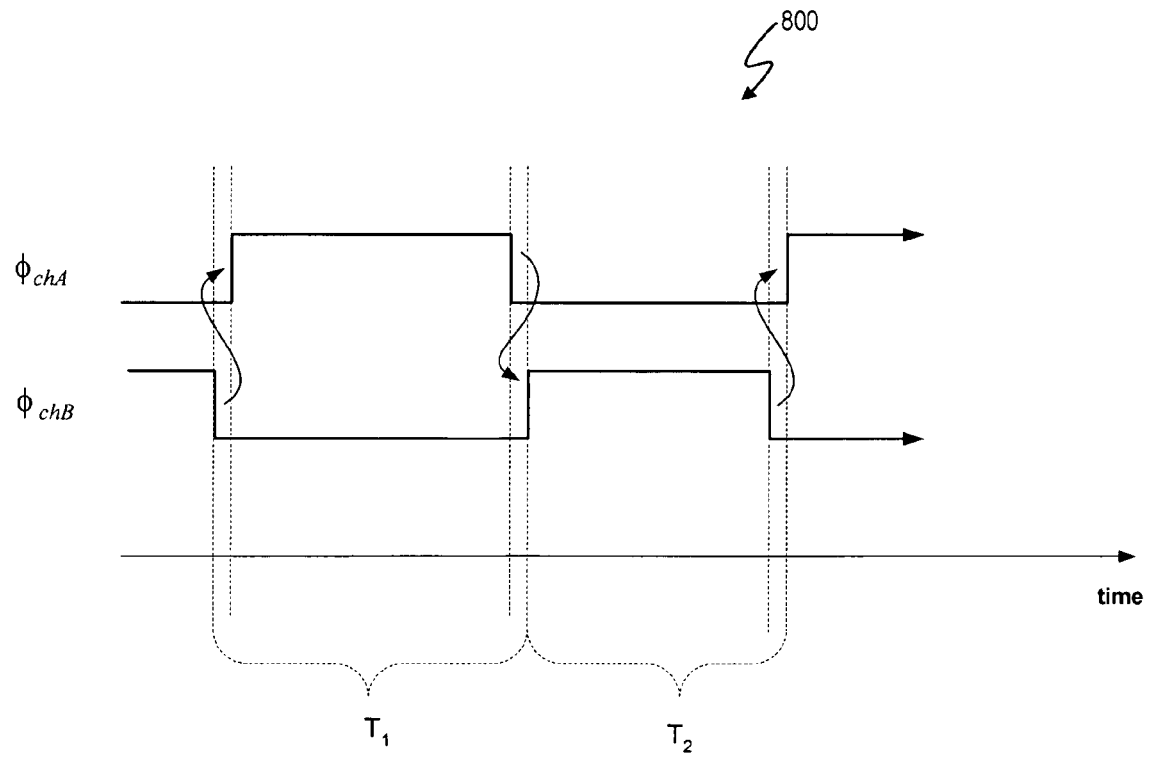
FIG. 8 depicts an exemplary timing diagram for the chopping circuit of FIG. 7 during subsequent periods of time $T_1$ and $T_2$.

FIG. 8 depicts an exemplary timing diagram 800 for the chopping circuit 700 during exemplary subsequent periods of time $T_1$ and $T_2$. In at least one embodiment, when control signals $\Phi_{chA}$ and $\Phi_{chB}$ are "high" (i.e. logical one (1)), respective switches 702 and 704 conduct, and switches 702 and 704 become nonconductive when respective control signals $\Phi_{chA}$ and $\Phi_{chB}$ are "low" (i.e. a logical zero (0)).

During period $T_2$, when switches 704 are conductive, the polarity of the output of converter 302.i is inverted. Thus, during period $T_2$, to restore proper polarity to the output of comparator 302.i, logic processing module 306 includes logic devices such as exclusive OR gates. For example, connecting the output of converter 302.i and the chopping control signal $\Phi_{chB}$ to respective inputs of exclusive OR gate 706.i, the output of exclusive OR gate 706.i maintains proper polarity, i∈{0, 1, . . . , M−1}. Used alone, the chopping technique removes quantizer non-linearity, but still exhibits noise modulation with dc level. This non-linearity removal may be sufficient improvement for many applications.

Figure 9:
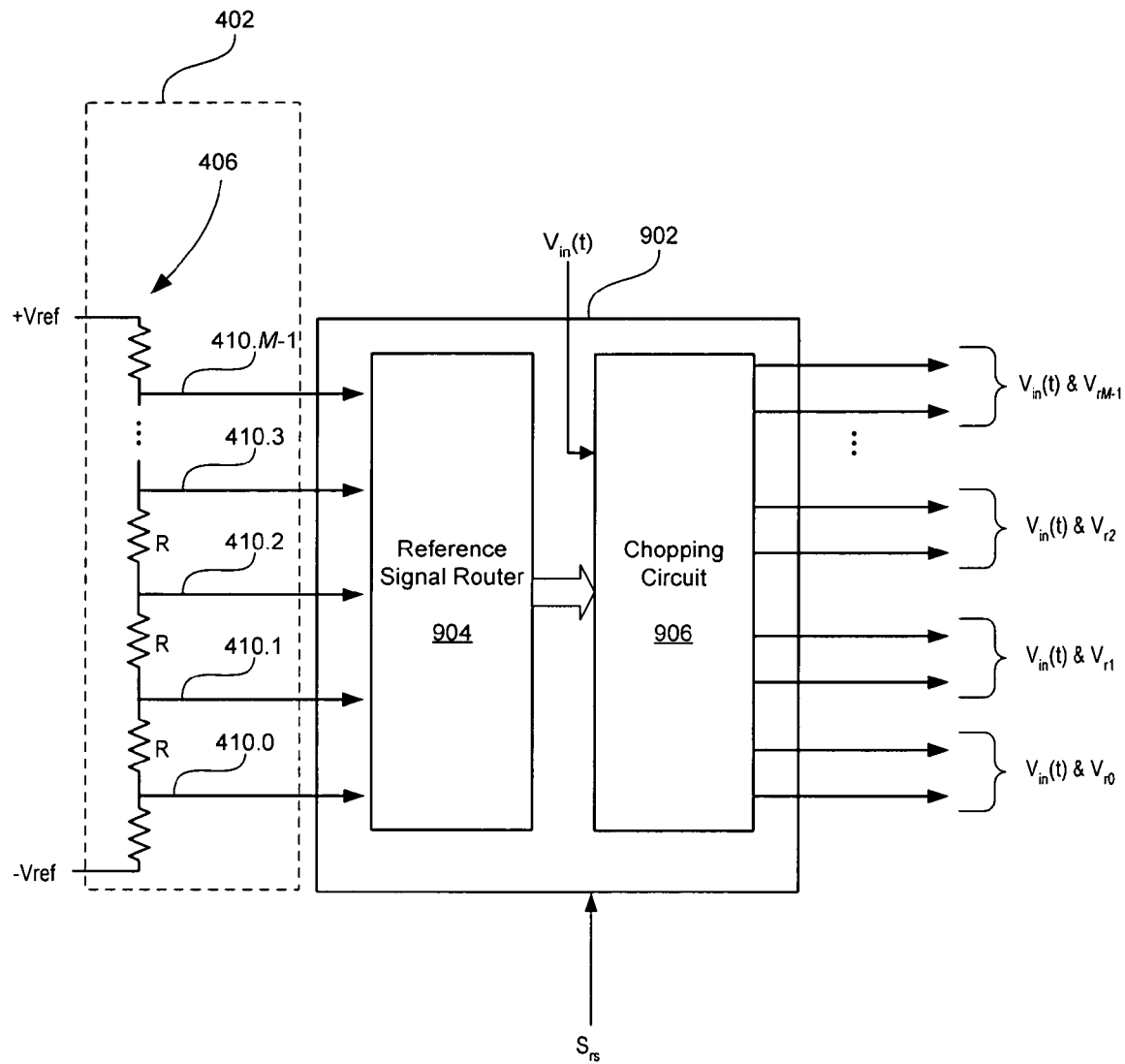
FIG. 9 depicts a combined reference signal router/chopping circuit matrix of the comparator offset converter of FIG. 4.

FIG. 9 depicts a combined reference signal router/chopping circuit matrix 902, which is one embodiment of comparator offset converter 404. Reference signal router 904, in at least one embodiment, is reference signal router 500, and, in at least one embodiment, is reference signal router 600. In at least one embodiment, chopping circuit 906 is chopping circuit 700. Chopping circuit 906 receives the rerouted reference signals 410.0 through 410.M−1 from reference signal router 904 and provides the toggled, rerouted reference signals $V_{r0}$ through $V_{rM−1}$ and quantizer input signal $V_{in}(t)$ to input terminals of respective comparators 302.0 through 302.M−1. In at least one embodiment, the combined reference signal router/chopping circuit 902 provides improved conversion of comparator offset voltages to additive, multi-spectral noise than reference signal router 500, reference signal router 600, or chopping circuit 700 alone.

Thus, a comparator offset converter randomly alters the reference signal-to-comparator input terminal associations. In at least one embodiment, the comparator offset converter maintains a 1:1 reference signal-to-comparator input terminal relationship. By maintaining the 1:1 ratio of reference signal-to-comparator input terminal and randomizing the reference signal-to-comparator input terminal associations, the comparator offset converter effectively converts the comparator offset voltage nonlinearities into energies and frequencies that can be constructively processed and, in at least one embodiment, improve signal-to-noise ratios.

Figure 10:
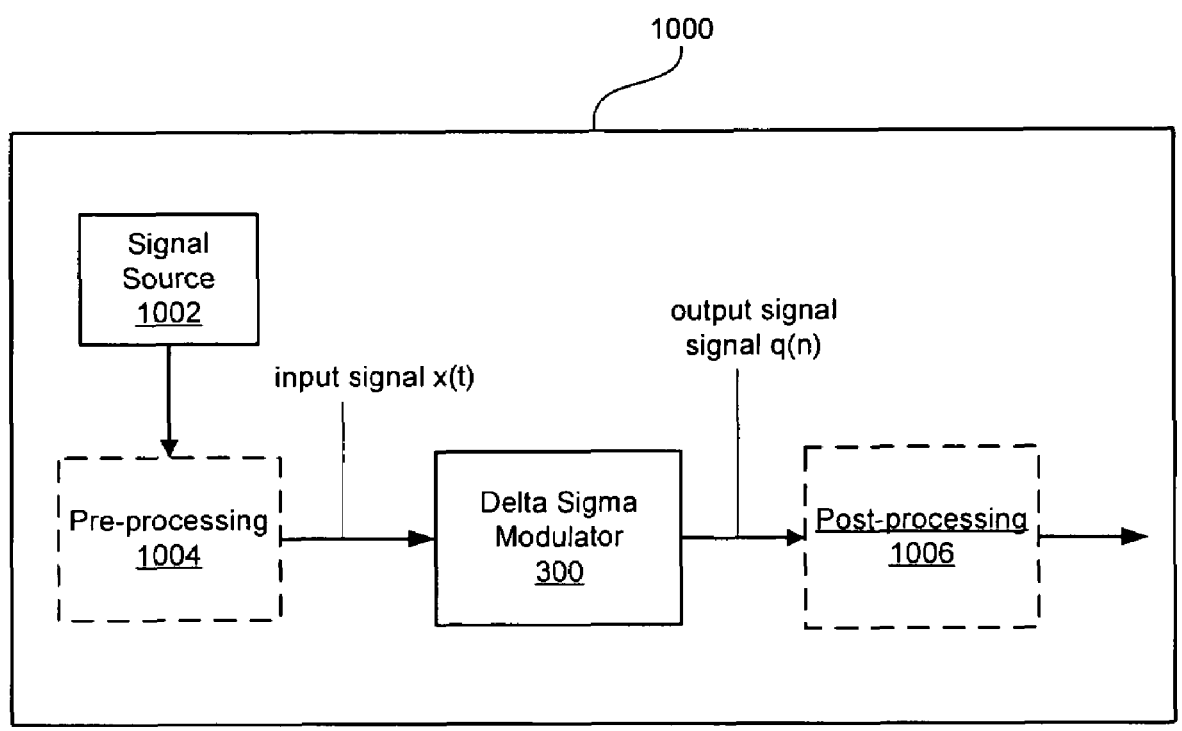
FIG. 10 depicts a signal processing system that includes a delta sigma modulator with a comparator offset noise converter.

FIG. 10 depicts a signal processing system 1000 that includes delta sigma modulator 300. The signal processing system 1000 is particularly useful for high-end audio applications. Signal processing system 1000 processes an input signal x(t) generated by an input signal source 1002. The input signal x(t) may be an audio signal, a video signal, an audio plus video signal, and/or other signal type. The input signal x(t) is, for example, an analog signal generated by a microphone. Generally, input signal x(t) undergoes some preprocessing 1004 prior to being modulated by delta sigma modulator 300. Exemplary preprocessing includes low pass filtering to attenuate out-of-band signals. Signal processing system 1000 also generally includes post-processing 1006, such as low-pass filtering the output signals q(n). Additional post-processing can include recording of the averaged, digital output onto a recording medium or providing the averaged, digital output to a device that utilizes digital signals such as a digital audio recorder and/or player.

Although the present invention has been described in detail, it should be understood that various changes, substitutions and alterations can be made hereto without departing from the spirit and scope of the invention as defined by the appended claims. For example, although specific embodiments of reference signal routers have been described herein, other configurations and configurable signal routing technology can be used to reroute the reference signals to comparator input terminals during subsequent periods of time.

What is claimed is:

1. A signal processing system comprising:
   an analog-to-digital delta sigma modulator comprising:
   a loop filter, coupled to the multiple comparators, to provide an input signal to be quantized;

multiple comparators coupled to the loop filter, each of the comparators having two input terminals to respectively receive a reference signal and the input signal to be quantized and each comparator having an offset; and a comparator offset converter, coupled to the N comparators, to reroute N respective reference signals from a first arrangement of comparator input terminals to a second arrangement of comparator input terminals during successive delta sigma modulator output cycles to convert the comparator offsets into noise, wherein N is an integer greater than one (1).

2. The signal processing system of claim 1 wherein the comparator offset converter further comprises:

a reference signal router to reroute each respective reference signal from the first arrangement of comparator input terminals during a first time period to the second arrangement of comparator input terminals during a second time period.

3. The signal processing system of claim of claim 2 wherein in the second arrangement of comparator input terminal is a random reordering of the first arrangement of comparator input terminals.

4. The signal processing system of claim 2 wherein the first period of time is one delta sigma modulator output cycle.

5. The signal processing system of claim 1 wherein the comparator offset converter further comprises:

a chopping circuit coupled to the input terminals of the comparators to toggle the input terminals of each of the comparators to reroute each respective reference signal from a first input terminal of each comparator to a second input terminal of each comparator; and a logic device coupled to each output terminal of the comparators to maintain predetermined polarity of output signals of the multiple comparators.

6. The signal processing system of claim 1 wherein the comparator offset converter further comprises:

a reference signal router to reroute each respective reference signal during subsequent periods of time;

a chopping circuit coupled between the reference signal router and the input terminals of the comparators to toggle the input terminals of each of the comparators to reroute each respective reference signal from a first input terminal of each comparator to a second input terminal of each comparator; and a logic device coupled to each output terminal of the comparators to maintain predetermined polarity of output signals of the multiple comparators.

7. The signal processing system of claim 1 wherein the multiple comparators are a proper subset of the multiple comparators in a quantizer of the delta sigma modulator.

8. The signal processing system of claim 1 further comprising:

a reference signal generator coupled to the multiple comparators to provide each reference signal.

9. The signal processing system of claim 1 wherein the comparators generate comparison data between respective reference signals and the input signal, the system further comprising:

an encoder coupled to output terminals of the multiple comparators to convert the comparison data into a digital output.

10. The signal processing system of claim 1 wherein the noise is white noise.

11. A method of converting delta sigma modulator comparator offsets into noise, the method comprising:

receiving N reference signals on a first arrangement of input terminals of N respective comparators of the delta sigma modulator during a first period of time, wherein N is an integer greater than one (1); and rerouting the N reference signals to a second arrangement of input terminals of the respective comparators of the delta sigma modulator during a second period of time to convert the comparator offsets into noise.

12. The method as in claim 11 wherein the first period of time and second period of time are successive delta sigma modulator output cycles.

13. The method as in claim 11 wherein rerouting the reference signals to a second arrangement of input terminals of the respective comparators of the delta sigma modulator during a second period of time further comprises:

providing a routing signal to a multiplexer to reroute each respective reference signal from the first arrangement of comparator input terminals during the first time period to the second arrangement of comparator input terminals during a second time period.

14. The method as in claim 11 wherein rerouting the reference signals to a second arrangement of input terminals of the respective comparators of the delta sigma modulator during a second period of time further comprises:

toggling the input terminals of each of the comparators to reroute each respective reference signal from a first input terminal of each comparator to a second input terminal of each comparator; and maintaining predetermined polarity of output signals of the comparators.

15. The method as in claim 11 wherein rerouting the reference signals to a second arrangement of input terminals of the respective comparators of the delta sigma modulator during a second period of time further comprises:

rerouting the reference signals to a second random arrangement of input terminals of the respective comparators of the delta sigma modulator during a second period of time.

16. The method as in claim 11 further comprising:

receiving a quantization input signal;

comparing the quantization input signal to the reference signals to generate comparison data; and generating a quantizer output signal based upon comparison data.

17. A method of converting delta sigma modulator comparator offsets into noise, the method comprising:

receiving N reference signals on input terminals of N respective comparators of the delta sigma modulator during a first delta sigma modulator output cycle, wherein each reference signal is associated with one of the comparator input terminals to form a reference signal-to-comparator input terminal association to convert the comparator offsets into noise and N is an integer greater than (1); and altering at least one of the reference signal-to-comparator input terminal associations during a next delta sigma modulator output cycle to convert the comparator offsets into noise.

18. The method as in claim 17 wherein altering at least one of the reference signal-to-comparator input terminal associations during a second period of time further comprises:

randomly altering at least one of the reference signal-to-comparator input terminal associations during the second period of time.

19. A delta sigma modulator comprising:
a loop filter to receive an input signal and a quantizer output signal and generate a quantizer input signal; and
a quantizer to receive the quantizer input signal and generate the quantizer output signal, the quantizer comprising:
- a reference signal generator to generate N reference signals, wherein N is an integer greater than one (1);
- a plurality of N comparators to receive and compare the reference signals and the quantizer input signal and to generate comparison data;
- a comparator offset converter, coupled to the reference signal generator and to the N comparators, to receive the N respective reference signals on a first arrangement of input terminals of the N respective comparators during a first period of time and to reroute the N reference signals to a second arrangement of input terminals of the N respective comparators during a second period of time to convert comparator offsets to noise; and
- an encoder coupled to the comparators to receive the comparison data, to quantize the quantization input signal based upon the comparison data, and to generate the quantizer output signal.

20. A signal processing system comprising:
an analog-to-digital delta sigma modulator comprising:
- a loop filter, coupled to the multiple comparators, to provide an input signal to be quantized;
- multiple comparators coupled to the loop filter, each of the comparators having two input terminals to respectively receive a reference signal and the input signal to be quantized and each comparator having an offset; and
- a comparator offset converter, coupled to the N comparators, to reroute N respective reference signals from a first arrangement of comparator input terminals to a second arrangement of comparator input terminals to convert the comparator offsets into noise, wherein N is an integer greater than one (1);
- wherein the comparator offset converter further includes a reference signal router to reroute each respective reference signal from the first arrangement of comparator input terminals during the first time period to the second arrangement of comparator input terminals during a second time period.

21. A signal processing system comprising:
an analog-to-digital delta sigma modulator comprising:
- a loop filter, coupled to the multiple comparators, to provide an input signal to be quantized;
- multiple comparators coupled to the loop filter, each of the comparators having two input terminals to respectively receive a reference signal and the input signal to be quantized and each comparator having an offset; and
- a comparator offset converter, coupled to the N comparators, to reroute N respective reference signals from a first arrangement of comparator input terminals to a second arrangement of comparator input terminals to convert the comparator offsets into noise, wherein N is an integer greater than one (1)
- wherein the comparator offset converter further includes:
  - a chopping circuit coupled to the input terminals of the comparators to toggle the input terminals of each of the comparators to reroute each respective reference signal from a first input terminal of each comparator to a second input terminal of each comparator; and
  - a logic device coupled to each output terminal of the comparators to maintain predetermined polarity of output signals of the multiple comparators.

22. A signal processing system comprising:
an analog-to-digital delta sigma modulator comprising:
- a loop filter, coupled to the multiple comparators, to provide an input signal to be quantized;
- multiple comparators coupled to the loop filter, each of the comparators having two input terminals to respectively receive a reference signal and the input signal to be quantized and each comparator having an offset; and
- a comparator offset converter, coupled to the N comparators, to reroute N respective reference signals from a first arrangement of comparator input terminals to a second arrangement of comparator input terminals to convert the comparator offsets into noise, wherein N is an integer greater than one (1);
- wherein the comparator offset converter further includes:
  - a chopping circuit coupled to the input terminals of the comparators to toggle the input terminals of each of the comparators to reroute each respective reference signal from a first input terminal of each comparator to a second input terminal of each comparator; and
  - a logic device coupled to each output terminal of the comparators to maintain predetermined polarity of output signals of the multiple comparators.

* * * * *